United States Patent
Matarrese et al.

(10) Patent No.: US 6,594,177 B2
(45) Date of Patent: Jul. 15, 2003

(54) REDUNDANCY CIRCUIT AND METHOD FOR REPLACING DEFECTIVE MEMORY CELLS IN A FLASH MEMORY DEVICE

(75) Inventors: Stella Matarrese, Fremont, CA (US); Luca Giovanni Fasoli, Fremont, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/922,176

(22) Filed: Aug. 2, 2001

(65) Prior Publication Data

US 2003/0026131 A1 Feb. 6, 2003

(51) Int. Cl.[7] ............................................. G11C 16/04
(52) U.S. Cl. ............................ 365/185.11; 365/185.09; 365/185.33; 365/200
(58) Field of Search ....................... 365/185.09, 185.11, 365/200, 230.03, 185.05, 185.12, 185.13, 185.23, 185.33

(56) References Cited

U.S. PATENT DOCUMENTS

| | | | | |
|---|---|---|---|---|
| 5,592,417 | A | | 1/1997 | Mirabel .................. 365/185.07 |
| 5,822,256 | A | * | 10/1998 | Bauer et al. ............ 365/185.09 |
| 5,966,336 | A | | 10/1999 | Horiguchi et al. .......... 365/200 |
| 6,307,795 | B1 | * | 10/2001 | Blodgett ................... 365/200 |
| 6,320,800 | B1 | * | 11/2001 | Saito et al. ................. 365/200 |
| 2001/0028584 | A1 | | 10/2001 | Nakayama et al. .......... 365/203 |
| 2002/0012282 | A1 | | 1/2002 | Saito et al. ................. 365/200 |
| 2002/0060934 | A1 | | 5/2002 | Choi et al. ................. 365/200 |

FOREIGN PATENT DOCUMENTS

| | | |
|---|---|---|
| DE | 19825012 A1 | 8/1999 |
| EP | 0745995 A1 | 12/1996 |
| WO | WO96/31882 A1 | 10/1996 |

OTHER PUBLICATIONS

U.S. patent application Ser. No. 09/922,068, Matarrese et al., filed Aug. 2, 2001.
European Search Report, EP 02255361, dated Dec. 4, 2002.

* cited by examiner

*Primary Examiner*—David Nelms
*Assistant Examiner*—Gene N. Auduong
(74) *Attorney, Agent, or Firm*—Lisa K. Jorgenson; Andre Szuwalski

(57) ABSTRACT

A method and circuit are disclosed for replacing defective columns of flash memory cells in a flash memory device. The circuit includes a plurality of sets of storage elements, each set of storage elements being capable of identifying a single addressed column of memory cells is to be replaced or a main column line and regular columns of memory cells associated therewith to be replaced. In the event a main column line and the associated regular columns are identified for replacement by a set of storage elements, the set additionally indicates whether the regular columns are regular columns in a single block of memory cells or multiple blocks. Redundancy circuitry performs the replacement operation during a memory access operation based upon the information stored in the sets of storage elements.

33 Claims, 3 Drawing Sheets

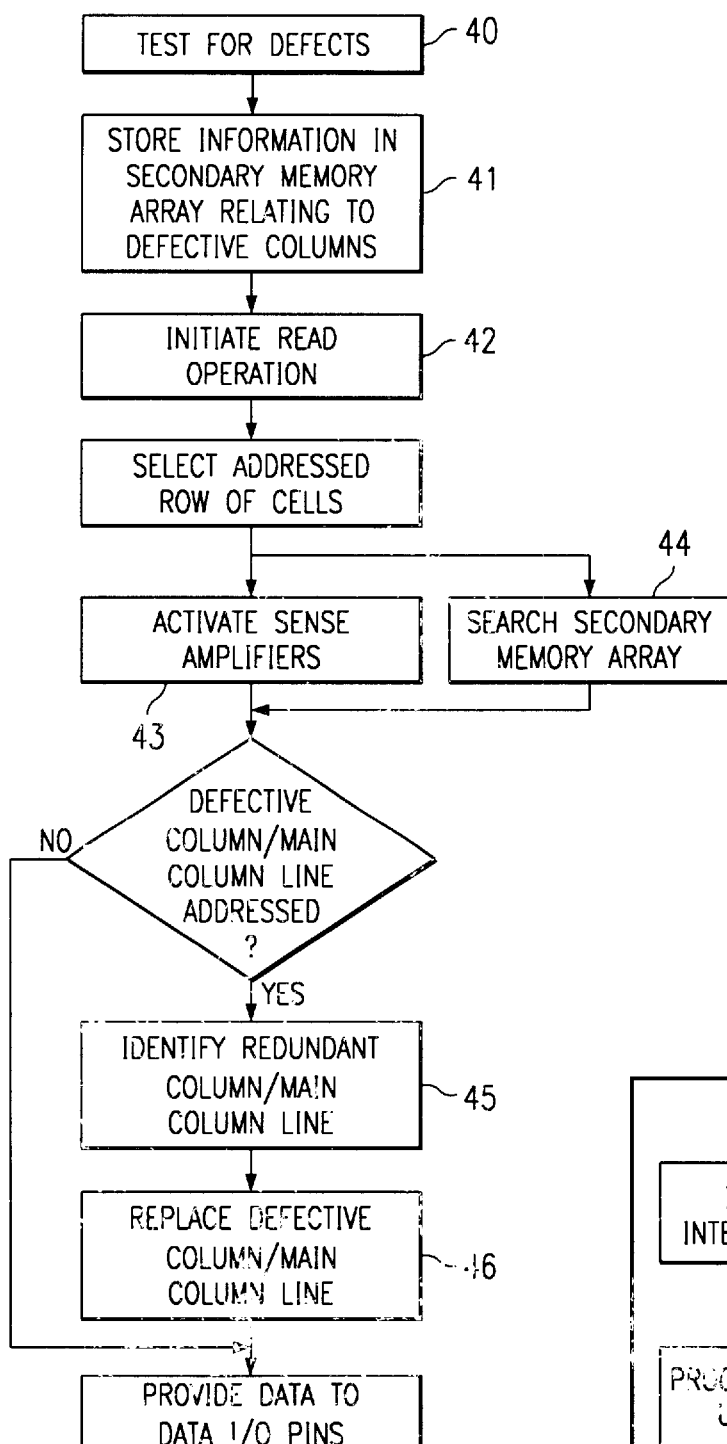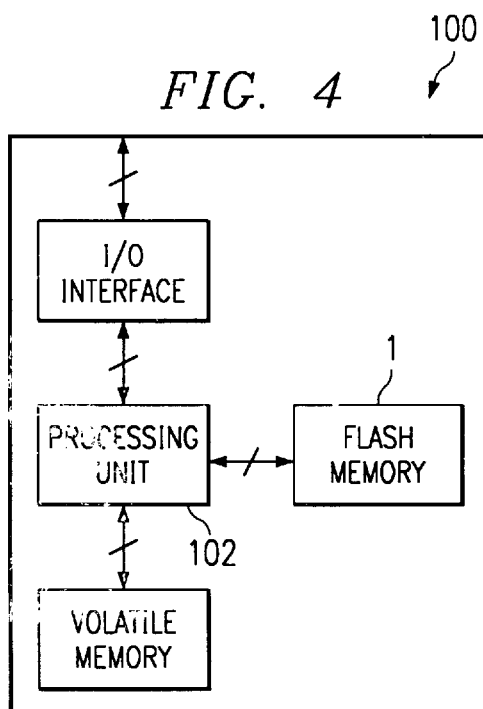

REDUNDANCY CIRCUIT AND METHOD FOR REPLACING DEFECTIVE MEMORY CELLS IN A FLASH MEMORY DEVICE

BACKGROUND OF THE INVENTION

1. Technical Field of the Invention

The present invention relates to a redundancy technique for nonvolatile memory devices, and particularly to a circuit and method for replacing defective memory cells in a nonvolatile memory device based upon the type of defect.

2. Description of the Related Art

The first nonvolatile memories were electrically programmable read-only memories (EPROMs). In these memories, the memory cells include a floating-gate transistor that is programmable using the hot carrier effect. Programming of an EPROM memory cell includes applying a potential difference between the drain and the source of the floating gate transistor in the presence of a high potential difference (of about 20 volts, this value varying according to the desired programming speed) between the control gate and the source. The application of the first of these potential differences generates an electrical field that gives rise to a flow of electrons in the channel. These electrons collide with atoms of the channel, causing the appearance of new free electrons. These electrons have very high energy (hence the term "hot carriers"). The high difference in potential between the control gate and the source of the floating gate transistor gives rise to a strong electrical field between the floating gate and the substrate, the effect of which is that certain of these electrons are injected into the floating gate, thus putting the memory cell in a state known as a "programmed" state.

The fact that the programming of a memory cell requires the application of voltages both to the control gate and to the drain of the floating-gate transistor eliminates the need for the use of a selection transistor to program one particular memory cell without programming the others. This results in a relatively small silicon area and the effectuation of large scale integration. By contrast, the erasure of all the memory cells of the memory is done substantially simultaneously by exposing the memory cells to ultraviolet radiation.

In addressing the need to individually erase EPROM memory cells, electrically erasable programmable read only memories (EEPROMs) were created. These memories are electrically programmable and erasable by tunnel effect (i.e., the Fowler Nordheim effect). The memory cells have a floating-gate transistor whose drain is connected to the bit line by a selection transistor. The gate of the selection transistor is connected to the word line. The gate of the floating-gate transistor is controlled by a bias transistor. Generally, the source of the floating gate transistor is connected to a reference potential, such as ground. These floating-gate transistors have an oxide layer between the substrate and the floating gate that is very thin to enable the transfer of charges by tunnel effect. The advantage of EPROMs as compared with EPROMs lies in the fact that each memory cell is programmable and erasable independently of the other EEPROM cells. The tradeoff here is that a larger surface area of silicon is required and therefore a smaller scale of integration is achieved.

A third type of memory has more recently gained popularity. This type of memory, flash EPROMS, combines the relatively high integration of EPROMs with the ease of programming and erasure of EEPROMs. Flash memory cells can be individually programmed utilizing the hot carrier effect in the same way as EPROM cells are programmed. Flash memory cells are also electrically erasable by the tunnel effect. The memory cells of a flash EPROM memory includes a floating-gate transistor that has an oxide layer whose thickness is greater than the oxide layer thickness of an EEPROM floating gate transistor but smaller than the oxide layer thickness of an EPROM floating gate transistor. Consequently, the flash memory cell is capable of erasure by the tunnel effect. For erasure, a highly negative potential difference is created between the control gate and the source of the floating gate transistor, the drain being left in the high impedance state or connected to the ground potential so that a high electrical field is created which tends to remove the electrons from the floating gate.

Referring to FIG. 1, flash EPROM devices, hereinafter referred to as flash memory devices, typically include at least one array A of flash memory cells organized into rows and columns of flash memory cells. Array A is typically partitioned into blocks B, each of which is further divided into sectors S. Each column of memory cells is coupled to a distinct local column line. Array A typically includes a plurality of main column lines. A plurality of local column lines are selectively connected to each main column line. Each local column line is connected to a distinct column of memory cells. Having the columns of memory cells and local column lines divided into sectors allows for erase operations to be performed on sectors of memory cells. Main column lines are also used to route a signal appearing on a local column line to the periphery of array A without an appreciable time delay or signal degradation. The use of local and main column lines in flash memory devices is known in the art.

A row decoder R and column decoder C are used to select a single row and at least one column of memory cells based upon the value of an externally generated address applied to the flash memory device. Sense amplifiers SA are coupled to the main column lines to amplify the voltage levels on the addressed column lines corresponding to the data values stored in the addressed flash memory cells. The particular implementations of array A, the row and column decoders and sense amplifiers SA are known in the art and will not be described further for reasons of simplicity.

Redundancy has been previously utilized in flash memory devices to, among other things, replace columns of memory cells having a defect with redundant columns of memory cells so as to improve manufacturing yield. Redundant columns RC are disposed in or immediately adjacent each block B. Each block B has a distinct set of redundant columns RC, as shown in FIG. 1. A redundant column RC is adapted to replace a column of flash memory cells having a defect (i.e., a defective column) in the block B with which redundant column RC is associated. Nonvolatile storage components SC, which may be maintained in a secondary array of memory cells, are utilized to identify whether the redundant columns RC are used to replace a defective column.

In one existing flash memory design, defective regular columns of memory cells are individually replaced with redundant columns of memory cells. A single storage component SC is associated with a distinct redundant column RC. Each storage component SC is capable of storing the column address of the defective column that the associated redundant column RC replaces, together with an enable bit to enable the column replacement during a memory access operation. This type of existing flash memory device is thereby capable of individually replacing defective columns in the flash memory array A with redundant columns of redundant memory cells. This existing redundancy strategy is more efficient in overcoming random failures appearing in array A, and is less efficient in overcoming clusters of failures therein.

In another existing flash memory design, main column lines and the columns of memory cells associated therewith are replaced as a set. Specifically, a storage component is capable of identifying for replacement a main column line and columns of memory cells associated therewith in a single block, together with an enable bit to enable the replacement during a memory access operation. This type of existing flash memory device is thereby capable of replacing defective columns in a set with a set of redundant columns RC of redundant memory cells. This existing redundancy strategy is more efficient in overcoming clusters of failures appearing in array A and less efficient in handling random failures in array A. Both of the above-described existing flash memory designs are relatively inflexible in that the storage components SC in each case are only available for efficiently overcoming a certain type of defect.

In addition to each of the above-described redundancy schemes being limited in efficiently replacing different types of defects, the ability of the above-described existing flash memory devices to replace defective columns of memory cells is limited as the number of defective columns increases. This reduced inability is due in part to the fact that the maximum number of redundant columns that can be used in a single word is equal to the number of sense amplifiers SAR used for sense amplification of the redundant columns RC. The reduced inability is also due to the fact that the maximum number of defective columns that can be replaced in any block B is equal to the number of redundant columns RC in a block B.

Based upon the foregoing, there is a need to more efficiently replace defective columns in flash memory devices.

SUMMARY OF THE INVENTION

Embodiments of the present invention overcome shortcomings in prior flash memory devices and satisfy a significant need for a flash memory device having improved repair probability for the redundant circuitry provided. According to a first exemplary embodiment of the present invention, a flash memory device includes sets of secondary storage elements, each of which is not rigidly associated with a single redundant column or main column line in a block of memory cells. Instead, each set of secondary storage elements is capable of identifying for replacement a column or at least one group thereof. In this way, the number of sets of secondary storage elements is not fixed to the number of redundant columns/main column lines and is instead based upon the maximum number of replacements that is desired to be replaced. Consequently, the repair probability is enhanced.

Each set of storage elements is capable of storing information identifying any of a regular (i.e., non-redundant) column of memory cells and a main column line in a block of memory cells as being defective. The flash memory device may further include redundancy circuitry for selectively replacing, during a memory read operation, any of a regular column of memory cells in a block and a main column line together with the corresponding regular columns of memory cells coupled thereto, based upon the information stored in a set of storage elements.

In addition or in the alternative, each set of storage elements is capable of storing information identifying for replacement a main column line and regular columns of memory cells associated therewith, and identifying whether the identified regular columns of memory cells are regular columns in a single block or in multiple blocks. The redundancy circuitry cooperates with the sets of storage elements to selectively replace, during a memory read operation, the identified main column line and identified regular columns associated therewith based upon the information stored in the at least one set of storage elements An exemplary flash memory device includes at least one array of memory cells arranged into rows and columns and partitioned into a plurality of sectors of memory cells grouped into blocks, such that each block of memory cells includes a plurality of redundant columns of memory cells. Address decode circuitry receives an externally-generated address and selects a row and at least one column of memory cells corresponding to the externally-generated address. The exemplary flash memory device further includes a secondary memory array having the plurality of sets of secondary storage elements located therein. The redundancy circuitry examines each set of secondary storage elements, selects a redundant column of memory cells, and replaces an addressed column with the selected, redundant column of memory cells, upon an affirmative determination that a set of secondary storage elements in the secondary memory array identifies the addressed column as being defective. Upon an affirmative determination that a set of secondary storage elements in the secondary memory array identifies an addressed regular column and other regular columns in a block that are associated with a main column line as being defective, the redundancy circuitry selects a main column line associated with redundant columns. Thereafter, the redundancy circuitry replaces the main column line and the defective column lines associated therewith with the selected main column and redundant columns

BRIEF DESCRIPTION OF THE DRAWINGS

A more complete understanding of the system and method of the present invention may be obtained by reference to the following Detailed Description when taken in conjunction with the accompanying Drawings wherein:

FIG. 3 is a flow chart illustrating an operation of the exemplary flash memory device of FIG. 2; and FIG. 4 is a block diagram of a computing/communications device having therein the flash memory device of FIG. 2.

DETAILED DESCRIPTION OF THE PREFERRED EXEMPLARY EMBODIMENTS

The present invention will now be described more fully hereinafter with reference to the accompanying drawings in which an exemplary embodiment of the invention is shown. This invention may, however, be embodied in many different forms and should not be construed as being limited to the embodiment set forth herein. Rather, the embodiment is provided so that this disclosure will be thorough and complete, and will fully convey the scope of the invention to those skilled in the art.

Figure 1:
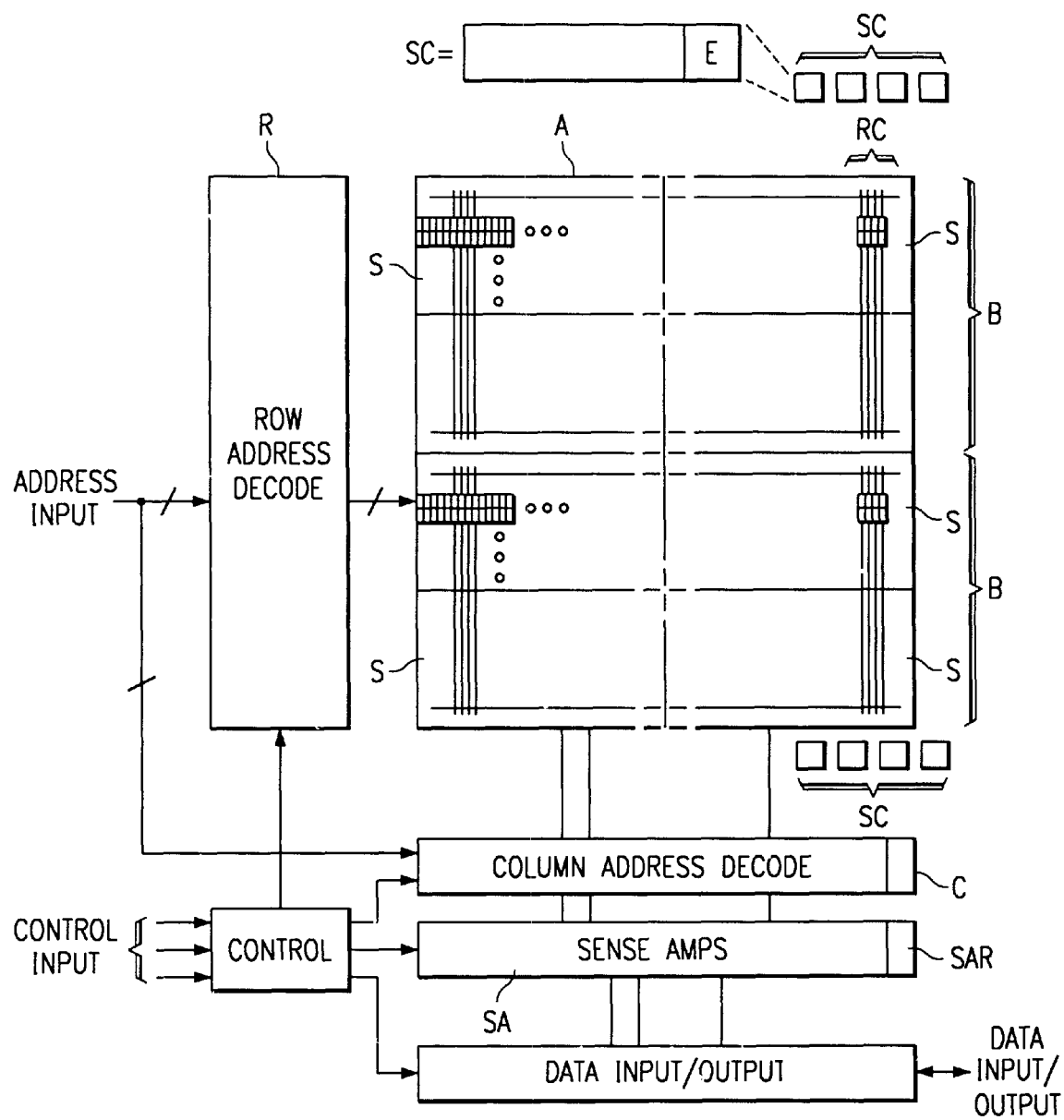
FIG. 1 is a block diagram of a known flash memory device.
Figure 2:
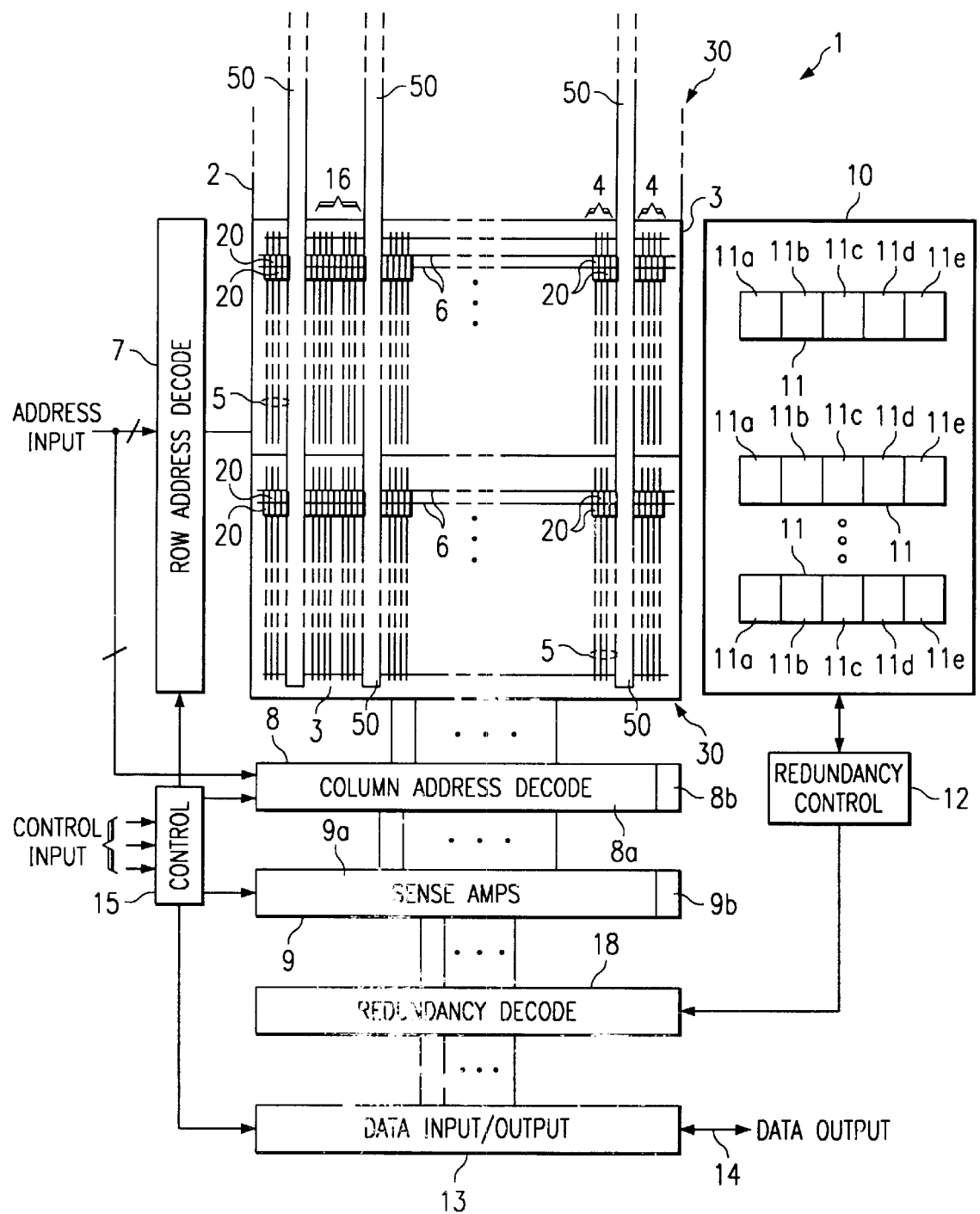
FIG. 2 is a block diagram of a flash memory device according to an exemplary embodiment of the present invention.

Referring to FIG. 2, there is shown a nonvolatile memory device 1 according to an exemplary embodiment of the present invention. Although it is understood that the nonvolatile memory device 1 may be virtually any type of nonvolatile memory device, nonvolatile memory device 1 will be described below as a bi-level flash memory device for reasons of simplicity.

In general terms, flash memory device 1 includes redundant circuitry for efficiently replacing columns of memory cells 20 having a defect. Flash memory device 1 includes one or more arrays or banks 2 of memory cells 20. Each array 2 of memory cells 20 may be arranged into rows and columns 16 of memory cells 20. According to the exemplary embodiment of the present invention, each array 2 is partitioned into sectors 3 of memory cells 20, with multiple sectors 3 being grouped into one or more blocks 30 of memory cells 20. Each block 30 of memory cells 20 may include a plurality of redundant columns 4 of redundant memory cells 20. Each redundant column 4 of redundant memory cells 20 may be capable of replacing any of a plurality of regular (i.e., non-redundant) columns 16 of memory cells 20 in the block 30 in which the redundant column 4 is disposed, as discussed in greater detail below. Although array 2 is illustrated in FIG. 2 as being divided into two or more sectors 3 of memory cells 20 that may form one or more blocks 30, it is understood that array 2 may be divided into more than two sectors 3 and blocks 30 of memory cells 20.

Array 2 is shown in FIG. 2 as being relatively sparsely populated with memory cells 20 for reasons of clarity. It is understood that array 2 is substantially entirely populated with memory cells 20, arranged in rows and columns of memory cells 20 as described above.

Within each sector 3 of a block, a local column line 5 may be connected to a distinct regular column 16 or redundant column 4 of memory cells. In addition, array 2 includes a plurality of main column lines 50 which extend substantially from one side of array 2, such as the top side, to an opposed side thereof. Because columns 16 of memory cells are disposed within sectors 3 so as to effectuate erase operations of memory cells 20 at the sector level, main column lines 50 are utilized to route addressed memory cells to the periphery of array 2. Each main column line 50 is coupled to a plurality of column lines 5 such that any associated column line 5 (and its corresponding column of memory cells) may be connected to a main column line 50 during a memory access operation.

Local columns 16 in different sectors 3 of the same block and having the same address within their respective sectors 3 are replaced by a single redundant column 4.

The redundant columns 4 of each block of memory cells 20 are adapted to replace defective regular columns 16 of memory cells 20 according to a predetermined replacement scheme. For instance, both the regular columns 16 and the redundant columns 4 in a block may be each divided into one or more sets, with each set of redundant columns 4 being capable of replacing columns 16 in a distinct set of regular columns. The particular redundant column 4 of a set of redundant columns that selectively replaces a defective regular column 16 of a set of columns in a block may be based upon the column address of the defective regular column 16. In particular, a portion of the column address of the column(s) to be replaced is used to identify the particular redundant column(s) 4 in the corresponding set of redundant columns 4 to be used in a column replacement. In this way, for a regular given column(s) 16 to be replaced, the redundant column(s) 4 that may selectively used in the replacement may be substantially quickly and simply determined.

Flash memory device 1 may further include row decode circuitry 7 which receives an externally generated address or portion thereof and selects and/or activates a row of memory cells 20 in a sector 3. In particular, the row of memory cells 20 corresponding to the externally generated address is selected and/or activated by being connected to column lines 5. Row decode circuitry 7 may include logic that, for example, in response to receiving an externally generated address, drives a single row line 6 corresponding to the externally generating address to a first voltage level to activate each memory cell in the row, while driving the remaining row lines 6 to another voltage level to deactivate the memory cells 20 in the remaining rows. Row decode circuitry 7 may be implemented with boolean logic gates as is known in the art.

Further, flash memory device 1 may include column decode circuitry 8 which receives an externally generated address and selects one or more columns 16 corresponding to the externally generated address. Column decode circuitry 8 may, for example, be implemented as multiplexing circuitry connected to each column line 5 in array 2 for connecting, based upon the received address, the column lines 5 associated with the addressed columns 16 to their corresponding main column lines 50 and for selecting such main column lines 50. In this way, the local column lines 5 associated with the addressed columns 16, having the data values from the addressed memory cells 20, are provided externally to array 2 for subsequent amplification. Column decode circuitry 8 may include decode circuitry 8a for selecting one or more local column lines 5 associated with the addressed columns 16 as described above, and redundant decode circuitry 8b for selecting one or more column lines 5 associated with redundant columns 4 of redundant memory cells 20. Column decode circuitry 8b connects the column line 5 of one or more redundant columns 4 to redundant main column lines 50 so that data values from selected redundant memory cells 20 are provided externally to array 2 for subsequent amplification.

During a memory read operation, addressed memory cells 20 are connected to the main column lines 50 corresponding thereto, as explained above. Typically, the connection of the addressed memory cells 20 to their corresponding main column lines 50 results in the main column lines 50 being at one of two voltage levels. Flash memory device 1 may include sense amplifiers 9 that sense the voltage levels on the main column lines 50 corresponding to the data stored in the addressed memory cells 20 and drive output signals of the sense amplifiers 9 to voltage levels that are more easily interpreted or otherwise handled by circuitry external to array 2. Sense amplifiers 9 may include sense amplifiers 9a coupled to main column lines 50 of regular columns 16, and sense amplifiers 9b coupled to main column lines of redundant columns 4.

Flash memory device 1 may include a data input/output (I/O) circuit 13 that generally couples addressed memory cells 20 to external I/O data pins 14 of flash memory device 1. As shown in FIG. 2, data I/O circuit 13 is coupled to the output of sense amplifiers 9. Flash memory device 1 may also include control circuitry 15 for receiving externally generated, input control signals and controlling the various components of flash memory device 1 (row decode circuitry 7, column decode circuitry 8, sense amplifiers 9, data I/O circuit 13, etc.) to perform memory access operations.

In general terms, flash memory device 1 is adapted to selectively replace individual regular columns 16 of memory cells 20, groups of regular columns 16 that are associated with a main column line 50 in a block, and groups of regular columns 16 in all blocks that are associated with a main column line 50.

In this way, flash memory device 1 is capable of efficiently overcoming random defects as well as clusters thereof existing in array 2 associated with local column lines 5 and main column lines 50.

Flash memory device 1 may include a secondary array 10 of memory cells for maintaining a record of column replacements to occur in array 2. Secondary array 10 may include flash memory cells or other non-volatile memory cells/data storage circuits. The memory cells of secondary array 10 may be organized into sets 11 of memory cells. According to the exemplary embodiment of the present invention, each set 11 of memory cells in secondary array 10 is capable of identifying for replacement any defective regular column 16 of memory cells 20, or any groups thereof. In other words, each set 11 of memory cells in secondary array 10 is not rigidly associated with only one redundant column 4 of redundant memory cells 20 for replacing a defective regular column 16. In addition, each set 11 of memory cells in secondary array 10 is not rigidly associated with only one group of redundant columns 4 of redundant memory cells 20 for replacing a defective group of regular columns 16. There is no one-to-one correspondence between a set 11 of memory cells in secondary array 10 and a redundant column 4 or group of redundant memory cells 20. Secondary array 10 may be disposed, for example, adjacent to array 2. It is understood, however, that secondary array 10 may be a portion of array 2.

In order to be able to identify any individual column 16 in any block as having a defect, each set 11 of memory cells in secondary array 10 includes a sufficient number of memory cells to store a column address of the defective column 16 as well as the block address to identify the block in which the defective column 16 is located. Each set 11 includes a first sub-set 11a of memory cells capable of storing the column address of a defective column 16, and a second sub-set 11b of memory cells capable of storing the block address of the block in which the defective column 16 is located. A third sub-set 11c of memory cells indicates whether the set 11 has been programmed to store information relating to a defective column 16 in the array 2 of memory cells 20. The third sub-set 11c may be used to enable the replacement of a defective regular column 16 of memory cells 20 with a redundant column 4 of redundant memory cells 20 during a memory access operation.

In order to be able to selectively identify for replacement any group of regular columns 16 of memory cells 20 in an addressed block that is associated with a main column line 50, each set 11 of memory cells in secondary array 10 may further include a fourth sub-set 11d which indicates whether the set 11 corresponds to replacement of a single regular column 16 or a group of regular columns 16 that are coupled to a single main column line 50. The sub-set 11d of a group 11 may be, for example, a single memory cell capable of storing a single data bit. Replacement of a group of regular columns 16 in a block may be performed, for example, upon the presence of a cluster of defects in the block of memory cells 20.

In order to be able to selectively identify for replacement all of the groups of columns 16 of memory cells 20 associated with a main column line 50, each set 11 of memory cells in secondary array 10 may include a fifth sub-set 11e which indicates whether the regular columns 16 associated with a main column line 50 identified for replacement by the set 11 are regular columns 16 in a single block (i.e., a single group of regular columns 16) or in each block having regular columns 16 coupled to the main column line 50 (i.e., a plurality of groups of regular columns 16). In this way, flash memory device 1 may replace some or all of the regular columns 16 associated with a main column line 5. Replacement of all of the columns 16 associated with a main column line 50 may be chosen, for example, upon the existence of a cluster of defects that shorts a local column line 5 with a main column line 50 together, or main column lines 50 together. The value stored in fifth sub-set 11e may be seen as determining whether an addressed main column line 5 (and its corresponding regular columns 16) is replaced entirely or only with respect to a single block.

Flash memory device 1 may further include redundancy decode circuitry 18 coupled to receive the output of each sense amplifier 9 and selectively replace the output of one or more sense amplifiers 9a associated with a defective column 16 with the output of one or more sense amplifiers 9b associated with redundant columns 4. Redundancy decode circuitry 18 may be implemented, for example, with multiplexing circuitry to effectively replace the output of one or more sense amplifiers 9a with the output of one or more sense amplifiers 9b. Redundancy decode circuitry 18 replaces the output of a sense amplifier 9a with the output of a sense amplifier 9b based upon the contents of secondary array 10.

Redundancy decode circuitry 18 is implemented to replace the output of one or more sense amplifiers 9a with the output of one or more sense amplifier 9b, in order to minimize the timing of a memory read operation and/or maintain the timing of a memory read operation within acceptable limits. It is understood, however, that redundancy decode circuitry 18 may be implemented between column decode circuitry 8 and sense amplifiers 9 and/or otherwise made part of column decode circuitry 8. In this alternative implementation, redundancy decode circuitry 18 selectively replaces one or more column lines 5 associated with one or more defective regular columns 16 with one or more column lines 5 associated with one or more redundant columns 4 of memory cells. The output of redundancy decode circuitry 18 would, in this case, be connected to the input of sense amplifiers 9. In either implementation, the net effect is that defective columns 16 of memory cells are replaced with a redundant column 4 of memory cells based upon the contents of secondary array 10.

Flash memory device 1 may further include a redundancy control circuit 12 for generally performing replacements of defective regular columns 16 during a memory access operation based upon the contents of secondary array 10. In particular, redundancy control circuit 12 examines each set 11 of memory cells in secondary array 10 during a memory access operation to see if a regular column 16 or group thereof is identified for replacement by a set 11. In response to the examination, redundancy control circuit 12 initiates a replacement of one of more regular columns 16. As explained above, the replacement may be a single regular column 16 or one or more groups of columns 16 associated with a main column line 50.

In performing the examining and replacing operations, redundancy control circuit 12 and secondary array 10 may be seen as forming a content addressable memory (CAM) or otherwise performing CAM type operations.

The operation of flash memory device 1 in performing a memory read operation will be described with reference to FIG. 3. Initially, flash memory device 1 is tested for defects at step 40. Any discovered defects requiring column replacement are recorded in secondary array 10 at 41. In the event a random defect is discovered, the column address and block address of the corresponding regular column line 16 are stored in sub-sets 11a and 11b, respectively, of any set 11 of storage elements in secondary array 10. In addition, a value, such as a logic one, is stored in sub-set 11c to indicate that the set 11 now obtains column replacement information. Sub-set 11d of the set 11 is set to a value, such as logic one, to indicate that an individual regular column 16 is being replaced. At this point, the set 11 is fully programmed to facilitate the selective replacement of a single regular column 16 of memory cells 20 during a memory read operation.

In the event that a cluster of defects in a block is discovered, the column address (and/or main column line 50) and block address corresponding to a regular column 16 (main column line 50) in the sector 3 are stored in sub-sets 11a and 11b, respectively, of any set 11 in secondary array 10. Sub-set 11c is loaded with a value, such as a logic one, to indicate that the set 11 now obtains column replacement information. Sub-set 11d is set to a value, such as logic zero, to indicate that at least one group of regular columns 16 is to be replaced, instead of a single column 16 of memory cells 20. If the cluster of defects primarily effect the regular columns 16 in a single block, then a value, such as a logic zero value, is stored sub-set 11e of the chosen set 11 so as to indicate that all of the regular columns 16 associated with the main column line 50 in a single block (identified by sub-set 11b) are to be replaced. At this point, the set 11 is fully programmed to facilitate the replacement of a group of regular columns 16 (and their corresponding main column line 50) in a single block during a memory read operation.

In the event that a cluster of defects are discovered that effect the ability to use any group of regular columns 16 associated with a single main column line 50, the column address corresponding to the single main column line 50 that is impacted by the defect cluster is stored in sub-sets 11a of any set 11 in secondary array 10. The column address of the impacted main column line 50, of course, may be identified by using only a portion of the storage elements in sub-set 11a. Sub-set 11c is loaded with a value, such as a logic one, to indicate that the set 11 now obtains column replacement information. Sub-set 11d is set to a value, such as logic zero, to indicate that at least one group of regular columns 16 is to be replaced, instead of a single column 16 of memory cells 20. Because the cluster of defects effect the use of columns 16 associated with a main column line 50 in more than one block, a value, such as a logic one value, is stored sub-set 11e of the chosen set 11 so as to indicate that the main column line 50 (identified in sub-set 11a) and all of the regular columns 16 associated therewith are to be replaced. At this point, the chosen set 11 is fully programmed to facilitate the replacement of all of the regular columns 16 associated with the addressed main column line 50 during a memory read operation.

It is understood that steps 40 and 41 may be performed by the manufacturer before delivery of the flash memory device 1 to a user.

A memory read operation is subsequently initiated at 42 by applying to flash memory device 1 an externally generated address and input control signals. Upon reception of these input signals, row decode circuitry 7 selects a row of memory cells 20 in memory cell array 2, and column decode circuitry 8 selects column lines 5 associated with the addressed columns 16 for connection to sense amplifiers 9a.

At around this same time, redundancy control circuit 12 examines at 44 the content of secondary array 10 to see if secondary array 10 identifies any of the addressed columns 16 as being defective. If any group 11 of memory cells in secondary array 2 has stored therein the block address and column address corresponding to an addressed column 16 as well as an indication that only the addressed column 16 is to be replaced, then redundancy control circuit 12 determines at 45 the particular redundant column 4 that is to replace the addressed, defective column 16 identified by the group 11. This determination may, for example, be based in part upon the column address corresponding to the defective column 16. Once the particular redundant column 4 is identified, redundancy control circuit 12 controls at 46 redundancy decode circuitry 18 so that the output of sense amplifiers 9a associated with addressed columns 16 that are defect-free are connected to data I/O circuit 13, together with the output of sense amplifiers 9b associated with the particular redundant column 4 identified during step 45. In other words, control circuit 10 controls redundancy decode circuitry 18 so that the particular redundant column 4 identified by secondary array 2 replaces the corresponding defective column 16 at 45. Thereafter, the output of redundancy decode circuitry 18 is available to data I/O circuit 13 for driving the external data I/O pins 14 accordingly, thereby completing the memory read operation.

On the other hand, if any group 11 of memory cells in secondary array 2 has stored therein a column address corresponding to a main column line 50 as well as an indication that a group of regular columns 16 in a block (identified by the block address stored in sub-set 11b) are to be replaced, then redundancy control circuit 12 determines at 48 the particular redundant main column line 50 and corresponding redundant columns 4 in the addressed block that are to replace the main column line 50 and associated regular columns 16 in the addressed block. This determination may, for example, be based in part upon the column address. Once the particular redundant main column line 50 and corresponding redundant columns 4 in a block are identified, redundancy control circuit 12 controls at 49 redundancy decode circuitry 18 so that the output of sense amplifiers 9a associated with addressed regular columns 16 that are defect-free are connected to data I/O circuit 13, together with the output of sense amplifiers 9b associated with the particular redundant columns 4 identified during step 48. In other words, redundancy control circuit 12 controls redundancy decode circuitry 18 so that the particular redundant columns 4 identified by secondary array 10 replaces the corresponding defective columns 16 at 49. Thereafter, the output of redundancy decode circuitry 18 is available to data I/O circuit 13 for driving the external data I/O pins 14 accordingly, thereby completing the memory read operation.

Alternatively, if any group 11 of memory cells in secondary array 2 has stored therein a block address and the column address corresponding to a main column line 50 as well as an indication that all regular columns 16 associated with the main column line 50 are to be replaced, then redundancy control circuit 12 determines at 50 the particular redundant main column line 50 and corresponding redundant columns 4 that are to replace the main column line 50 and corresponding regular columns 16 identified by the group 11. This determination may, for example, be based in part upon the column address corresponding to the main column line 50. Once the particular redundant main column lines 50 and corresponding redundant columns 4 are identified, redundancy control circuit 12 controls at 51 redundancy decode circuitry 18 so that the output of sense amplifiers 9a associated with addressed regular columns 16 that are defect-free are connected to data I/O circuit 13, together with the output of sense amplifiers 9b associated with the particular redundant column 4 identified during step 50. In other words, redundancy control circuit 12 controls redundancy decode circuitry 18 so that the particular redundant columns 4 identified by secondary array 10 replaces the corresponding defective columns 16 at 49. Thereafter, the output of redundancy decode circuitry 18 is available to data I/O circuit 13 for driving the external data I/O pins 14 accordingly, thereby completing the memory read operation.

As discussed above, a shortcoming of prior redundancy schemes for flash memories results in a relatively low repair probability and/or redundancy efficiency. Because there is no one-to-one correspondence between sets 11 of memory cells in secondary array 10 and redundant columns 4, and because each set 11 may identify for replacement any defective column 16 or group thereof, less sets 11 of memory cells are needed to repair the same number of defective columns, relative to prior flash memory devices.

Because the number of groups 11 of memory cells in secondary array 10 is not tied to the number of redundant columns 4, the flash memory device 1 may increase the repair probability without increasing the number of groups 11 in secondary array 10. For instance, if the size of the blocks are halved (i.e., the number of blocks in array 2 are doubled), the repair probability increases. The only real effect the halving of the blocks has on secondary array 2 is that each group 11 in secondary array 2 must now include an additional bit for identifying the addressed block. As a result, the repair probability of flash memory device 1 may be increased without a substantial increase in the size of secondary array 10.

In addition, flash memory device 1 advantageously allows programming and/or assigning on-the-fly (i.e., at wafer test) to each set 11 of memory cells in secondary array 10 the type of column replacement to be associated with the set 11 of memory cells.

It is understood that flash memory device 1 may be utilized in any of a number of devices requiring nonvolatile memory. For instance, flash memory device 1 may be located in an electronics system 100 (FIG. 5) having a processing unit 102 that accesses data stored in flash memory device 1. System 100 may be, for example, a computer and/or data processing device, or a telecommunications device, such as a wireless telephone.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A nonvolatile memory device, comprising:
    a plurality of sectors of memory cells arranged relative to each other so as to form an array of memory cells, each sector comprising:
        a plurality of memory cells arranged into rows and columns, the columns of memory cells including addressable regular columns of memory cells and redundant columns of memory cells;
        a plurality of local column lines, each local column line being coupled to a distinct column of memory cells in the sector; and
        a plurality of main column lines, each main column line being connected to main column lines in the other sectors so that the main column lines extend substantially from one side of the array substantially to an opposed side thereof, each main column line being coupled to a plurality of local column lines in the sector;
    address decode circuitry for receiving an externally generated address and selecting a row, at least one regular column of memory cells and at least one main column line based upon the externally generated address;
    at least one set of storage elements for selectively storing information identifying for replacement any of a regular column of memory cells and a main column line; and
    redundancy circuitry for selectively and individually replacing a selected regular column of memory cells in the event the information stored in the at least one set of storage elements identifies the selected regular column of memory cells and selectively replacing a selected main column line together with the corresponding regular columns of memory cells coupled thereto in the event the information stored in the at least one set of storage elements identifies the selected main column line.

2. The nonvolatile memory device of claim 1, wherein:
the redundancy circuitry replaces the selected regular column with a redundant column.

3. The nonvolatile memory device of claim 1, wherein:
the nonvolatile memory device is disposed in an electronics device having a processing unit therein.

4. The nonvolatile memory device of claim 1, wherein:
the redundancy circuitry replaces the selected main column line and the regular columns associated therewith in a block upon an affirmative determination that the at least one set of storage elements identifies for replacement the selected main column line.

5. The nonvolatile memory device of claim 4, wherein:
the redundancy circuitry replaces the selected main column line and the regular column lines associated therewith with a main column line and redundant columns associated therewith.

6. The nonvolatile memory device of claim 1, wherein:
the at least one set of storage elements selectively stores a column address and a bit indicating whether the regular column of memory cells corresponding to the column address or a main column line corresponding to the column address is to be replaced.

7. The nonvolatile memory device of claim 1, wherein:
the sectors are grouped into blocks, with each block comprising one or more sectors;
the at least one set of storage elements identifies whether a main column line and the regular columns of memory cells associated with the main column line in a single block are to be replaced, and whether a main column line and the regular columns of memory cells associated therewith in a plurality of blocks are to be replaced.

8. The nonvolatile memory device of claim 7, wherein:
a single bit of the at least one set of storage elements identifies whether the regular columns associated with the main column line are regular columns in a single block or the plurality of blocks.

9. The nonvolatile memory device of claim 1, wherein:
the redundancy circuitry selectively replaces the selected main column line together with the corresponding regular columns of memory cells with a main column line associated with redundant columns of memory cells.

10. The nonvolatile memory device of claim 1, wherein:
the redundancy circuitry selectively determines the particular redundant column of memory cells to replace the regular column of memory cells identified in the at least one set of storage elements, and the particular main column line and corresponding redundant columns of memory cells to replace the main column line identified in the at least one set of storage elements, based upon the externally-generated address.

11. The nonvolatile memory device of claim 1, wherein:
the at least one set of storage elements is capable of identifying for replacement any main column line.

12. The nonvolatile memory device of claim 1, wherein:
the at least one set of storage elements selectively maintains an enable bit identifying whether the set of storage elements maintains address information corresponding to at least one regular column of memory cells to be replaced.

13. The nonvolatile memory device of claim 1, wherein:
the storage elements in the at least one set of storage elements comprise nonvolatile memory cells.

14. A method of performing a memory read operation on a nonvolatile memory device having an array of memory cells arranged into rows and columns, each column of memory cells being connected to a local column line, a plurality of main column lines, each main column line being coupled to a plurality of local column lines, and a secondary array of memory cells, comprising:
receiving an address corresponding to a row and at least one column of memory cells;
selecting the row of memory cells, the at least one column of memory cells and at least one main column line corresponding to the received address;
searching the secondary array of memory cells and determining whether any group of memory cells in the secondary array of memory cells identifies for replacement the selected at least one column of memory cells and the selected at least one main column line; and
based upon the searching, selectively and individually replacing the selected at least one column and selectively replacing the selected at least one main column line and corresponding regular columns associated therewith, with a redundant column of redundant memory cells and a main column line and corresponding redundant columns associated therewith, respectively.

15. The method of claim 14, further comprising:
upon the searching identifying to be replaced the selected main column line and regular columns associated therewith, identifying a main column line and redundant columns associated therewith to replace the identified main column line and regular columns associated therewith, based upon the searching.

16. The method of claim 14, further comprising:
initially identifying one or more defects in the flash memory device and storing in the secondary array of memory cells an address corresponding to the one or more defects and an indication whether a single regular column or a main column line and the regular columns associated with the main column line is to be replaced.

17. The method of claim 14, further comprising:
upon the step of searching identifying the selected main column line and regular columns associated therewith for replacement, determining whether the regular columns associated with the identified main column line are regular columns in a single block or a plurality of blocks; and the step of replacing comprises selectively replacing the selected main column line and regular columns associated therewith in the plurality of blocks based upon the determining.

18. The method of claim 14, further comprising:
upon the step of searching identifying the selected main column line and regular columns associated therewith to be replaced, determining whether the regular columns associated with the identified main column line are regular columns in a single block or a plurality of blocks; and
the step of replacing comprises replacing the main column line and regular columns that are associated therewith in a single block based upon the determining.

19. A nonvolatile memory device, comprising:
a plurality of sectors of memory cells arranged relative to each other so as to form an array of memory cells having a plurality of blocks of memory cells, each sector comprising:
a plurality of memory cells arranged into rows and columns, the columns of memory cells including addressable regular columns of memory cells and redundant columns of memory cells;
a plurality of local column lines, each local column line being coupled to a distinct column of memory cells in the sector; and
a plurality of main column lines, each main column line being connected to main column lines in the other sectors so that the main column lines extend substantially from one side of the array substantially to an opposed side thereof, each main column line being coupled to a plurality of local column lines in the sector;
address decode circuitry for receiving an externally generated address and selecting a row, at least one regular column of memory cells and at least one main column line based upon the externally generated address;
at least one set of storage elements for storing information identifying for replacement a main column line and regular columns of memory cells associated therewith, and indicating whether the identified regular columns of memory cells are regular columns in a single block or in multiple blocks; and
redundancy circuitry for selectively replacing the identified main column line and regular columns associated therewith in a single block, and selectively replacing the main column line and regular columns associated therewith in multiple blocks, based upon the indication and the information stored in the at least one set of storage elements.

20. The nonvolatile memory device of claim 19, wherein:
the at least one set of storage elements stores a column address corresponding to a regular column of memory cells as being defective, and a bit indicating whether the corresponding regular column is to be replaced and whether the main column line associated with the corresponding regular column is to be replaced.

21. The nonvolatile memory device of claim 19, wherein:
the redundancy circuitry replaces the identified main column line and regular columns associated therewith with a main column line and redundant columns associated therewith.

22. The nonvolatile memory device of claim 21, wherein:
one or more storage elements in the at least one set of storage elements stores a value indicative of whether the regular columns associated with the identified main column line in a block are to be replaced, and whether the regular columns associated with the identified main column line in a plurality of the blocks are to be replaced; and the redundancy circuitry performs the selective replacement based upon the value maintained in the one or more storage elements.

23. The nonvolatile memory device of claim 19, wherein:

the at least one set of storage elements maintains an address associated with the identified main column line, the maintained address serving to identify the identified main column line.

24. The nonvolatile memory device of claim 19, wherein:

the at least one set of storage elements maintains a column address of a regular column of memory cells, and indicates whether the regular column is to be individually replaced and whether the main column line coupled to the regular column having the column address is to be replaced together with the associated regular columns; and the redundancy circuitry performs the selective replacement based upon the column address maintained in the one storage element and by the at least one set of storage elements indicating whether the regular column is to be individually replaced and whether the main column line coupled to the regular column having the column address is to be replaced together with the associated regular columns.

25. The nonvolatile memory device of claim 24, wherein:

the at least one set of storage elements is capable of maintaining a column address of any regular column of memory cells, and indicates whether the regular column is to be individually replaced and whether the main column line coupled to the regular column having the column address is to be replaced together with the associated regular columns.

26. The nonvolatile memory device of claim 19, wherein:

the at least one set of storage elements is capable of identifying for replacement any main column line and regular columns of memory cells associated therewith, and identifying whether the identified regular columns of memory cells are regular columns in a single block or in multiple blocks.

27. A method of performing a memory read operation on a nonvolatile memory device having an array of memory cells arranged into rows and columns forming blocks of memory cells, each column of memory cells being connected to a local column line, a plurality of main column lines, and a secondary array of memory cells, comprising:

receiving an address corresponding to a row and at least one column of memory cells;

selecting the row of memory cells, the at least one column of memory cells and at least one main column line corresponding to the received address;

searching the secondary array of memory cells and determining whether any group of memory cells in the secondary array of memory cells identifies for replacement the selected at least one main column line and regular columns associated therewith, and whether the associated regular columns are regular columns in a single block or multiple blocks; and selectively replacing, during a memory read operation, the identified main column line and regular columns associated therewith based upon the searching and the determining.

28. An electronics device, comprising:

a processing unit; and a nonvolatile memory device coupled to the processing unit, comprising:

a plurality of sectors of memory cells arranged relative to each other so as to form an array of memory cells, each sector comprising:

a plurality of memory cells arranged into rows and columns, the columns of memory cells including addressable regular columns of memory cells and redundant columns of memory cells;

a plurality of local column lines, each local column line being coupled to a distinct column of memory cells in the sector; and a plurality of main column lines, each main column line being connected to main column lines in the other sectors so that the main column lines extend substantially from one side of the array substantially to an opposed side thereof, each main column line being coupled to a plurality of local column lines in the sector;

address decode circuitry for receiving an externally generated address and selecting a row, at least one regular column of memory cells and at least one main column line based upon the externally generated address;

at least one set of storage elements for selectively storing information identifying for replacement any of a regular column of memory cells and a main column line; and redundancy circuitry for selectively and individually replacing a regular column of memory cells selected by the address decode circuitry and selectively replacing a main column line selected by the address decode circuitry together with the corresponding regular columns of memory cells coupled thereto, based upon the information stored in the at least one set of storage elements.

29. The electronics device of claim 28 wherein each storage element of the at least one set of storage elements comprises a floating gate flash memory cell transistor.

30. The electronics device of claim 28, wherein the nonvolatile memory device comprises a flash memory device.

31. The electronics device of claim 28 wherein at least one storage element of the at least one set of storage elements selectively stores a bit value indicating whether the regular column of memory cells selected by the address decode circuitry is to be individually replaced, and whether the main column line selected by the address decode circuitry is to be replaced with the corresponding regular columns of memory cells.

32. The electronics device of claim 28, wherein the plurality of sectors form a plurality of blocks of memory cells, each block of memory cells comprising at least one sector, and the at least one set of storage elements selectively indicates whether the regular columns of memory cells coupled to the main column line selected by the address decode circuitry are regular columns of memory cells in a single block or in more than one block.

33. The electronics device of claim 32, wherein at least one storage element of the at least one set of storage elements stores a value indicating whether the regular columns of memory cells coupled to the main column line selected by the address decode circuitry are regular columns of memory cells in a single block or in more than one block.

* * * * *

UNITED STATES PATENT AND TRADEMARK OFFICE
CERTIFICATE OF CORRECTION

PATENT NO. : 6,594,177 B2
DATED : July 15, 2003
INVENTOR(S) : Stella Matarrese et al.

It is certified that error appears in the above-identified patent and that said Letters Patent is hereby corrected as shown below:

Column 1,
Line 58, replace "advantage of EPROM's" with -- advantage of EEPROM's --

Column 6,
Line 52, replace "column lines of" with -- column lines 5 of --

Signed and Sealed this

Fourteenth Day of October, 2003

JAMES E. ROGAN
*Director of the United States Patent and Trademark Office*